(12) United States Patent
Zhang (10) Patent No.: US 12,105,171 B2
(45) Date of Patent: Oct. 1, 2024

(54) SYSTEM FOR AUTOMATICALLY CONTROLLING CHEMICAL SHIFT DIRECTION

(71) Applicant: Siemens Healthcare GmbH, Erlangen (DE)

(72) Inventor: Qiong Zhang, Shenzhen (CN)

(73) Assignee: Siemens Healthineers AG, Erlangen (DE)

(*) Notice: Subject to any disclaimer, the term of this patent is extended or adjusted under 35 U.S.C. 154(b) by 340 days.

(21) Appl. No.: 17/476,817

(22) Filed: Sep. 16, 2021

(65) Prior Publication Data

US 2022/0082645 A1    Mar. 17, 2022

(30) Foreign Application Priority Data

Sep. 17, 2020    (CN) .......................... 202010979058.0

(51) Int. Cl.
*G01R 33/48*    (2006.01)
*G01R 33/56*    (2006.01)

(52) U.S. Cl.
CPC ..... *G01R 33/4828* (2013.01); *G01R 33/5607* (2013.01); *G01R 33/5608* (2013.01)

(58) Field of Classification Search
CPC .... G06V 10/25; A61B 5/055; G01R 33/5635; G01R 33/4818; G01R 33/4833; G01R 33/4838; G01R 33/485; G01R 33/543
See application file for complete search history.

(56) References Cited

U.S. PATENT DOCUMENTS 5,510,713 A * 4/1996 Bernstein ........... G01R 33/4838
324/309
2012/0226141 A1* 9/2012 Shinoda ............... G01R 33/543
600/419

* cited by examiner

*Primary Examiner* — Gerald Johnson
(74) *Attorney, Agent, or Firm* — Banner & Witcoff Ltd.

(57) ABSTRACT

The disclosure relates to techniques for saturation band MRI scanning. The techniques include obtaining the position of a saturation band of the saturation band MRI, obtaining the position of the region of interest to be imaged, taking the direction from the saturation band to the region of interest as a first direction, determining the direction of the slice selection gradient, and starting saturation band MRI scanning.

12 Claims, 9 Drawing Sheets

SYSTEM FOR AUTOMATICALLY CONTROLLING CHEMICAL SHIFT DIRECTION

CROSS-REFERENCE TO RELATED APPLICATIONS

The present application claims the benefit of the filing date of China patent application no. CN 202010979058.0, filed on Sep. 17, 2020, the contents of which are incorporated herein by reference in their entirety.

TECHNICAL FIELD

The disclosure relates to the field of magnetic resonance imaging (MRI) and, in particular, to techniques related to saturation band MRI scanning.

BACKGROUND

With MRI, a radio frequency (RF) pulse at a specific frequency is applied to a human body in a static magnetic field, so that hydrogen protons in the human body are excited to generate magnetic resonance (MR). After the pulse is stopped, an MR signal is generated during relaxation of the protons, and an MR image is produced through the processes of MR signal reception, spatial encoding, image reconstruction, etc.

During the imaging process, after the RF excitation the slice is first selected through the Z-direction gradient, i.e., a slice to be imaged is selected; then the magnetic field in the Y direction is turned on, so that the magnetic moment will precess at different speeds at different Y positions; the Y gradient is then turned off, so that the magnetic moment will precess at the same speed again at all the positions, but the different precession speeds cause different phase deviations at different Y positions; the process is called phase encoding. Next, the gradient in the X direction is turned on, and the magnetic moment will precess at different speeds at different X positions; the process is called frequency encoding. At this point, through phase encoding and frequency encoding, each position of a 2D image can be determined. The signal collected by the receiving coil is a k-space signal, and an image can be obtained through Fourier transform. Then, another round of slice selection can be completed through the Z-direction gradient, and a 3D MRI image can be obtained by repeating the above process.

Because the hydrogen protons in adipose tissue and other tissues in the human body are in different molecular environments, their resonance frequencies are different; when the hydrogen protons in fat and other tissues are simultaneously excited by radio frequency pulses, they will have different relaxation times. When signals at different echo times are collected, fat tissue and non-fat tissue show different signal intensities. Taking advantage of the above characteristics of different tissues in the human body, a variety of pulse sequences have been developed to suppress fat signals.

Fat saturation (FATSAT) is a radio frequency selective fat suppression method. The basic principle is to use the small difference in the resonance frequency between fat and water, and selectively place fat into saturation by adjusting the frequency and bandwidth of the excitation pulse so that fat protons will not generate a signal, and an imaging containing only the water proton signal is obtained. When a FATSAT sequence begins, the selected slice is excited by a 90° RF pulse at the same resonance frequency as that of fat (saturation pulse), to flip the macroscopic magnetization vector of fat to the transverse (X-Y) plane; after the excitation pulse, a spoiling (phase destroying) gradient pulse is immediately applied, to destroy the consistency of fat signal phase. The imaging pulse is applied immediately afterwards. Since the time between echo signal acquisition and the saturation pulse is very short (<100 ms), fat protons do not have enough time to recover the longitudinal magnetization vector, and no signal is generated, thus achieving the purpose of fat suppression.

SUMMARY

Figure 1:
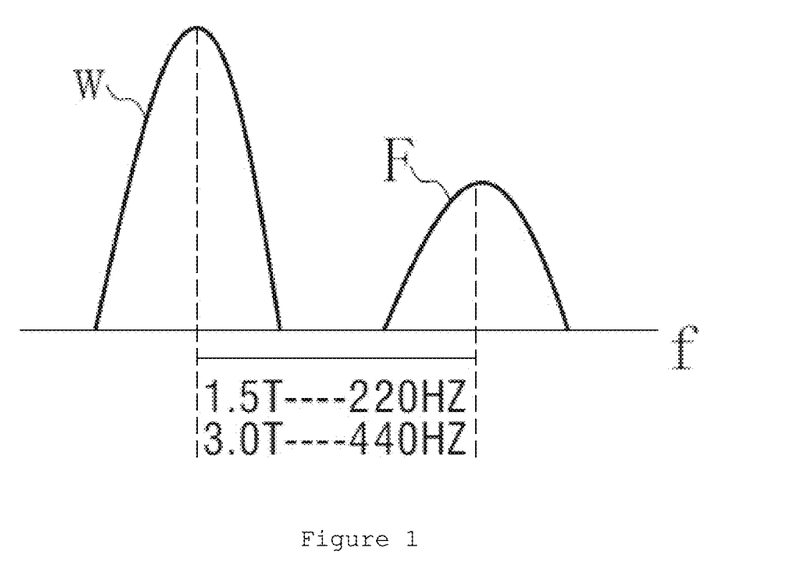
FIG. 1 is a schematic diagram of the chemical shift between water and fat.
Figure 2A:
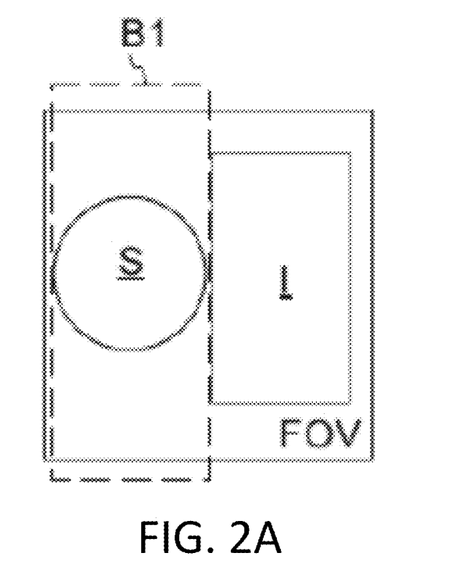
FIGS. 2A-2D illustrate a comparison of the chemical shift of a saturation band when the hard-coding method is used and when the hard-coding method is not used.
Figure 2B:
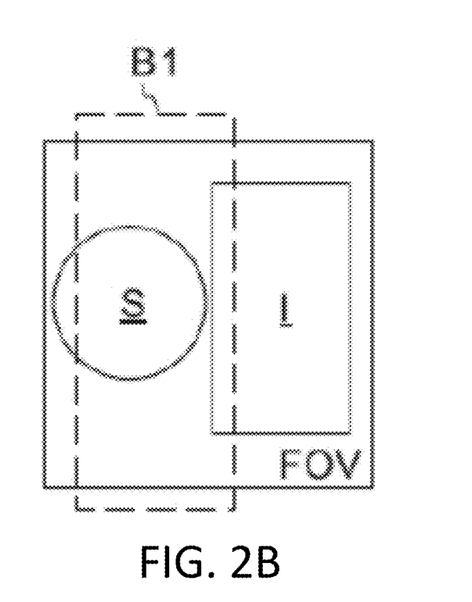
Figure 2C:
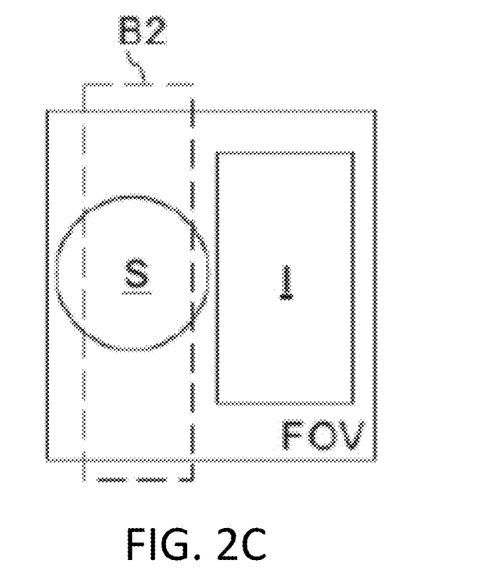
Figure 2D:
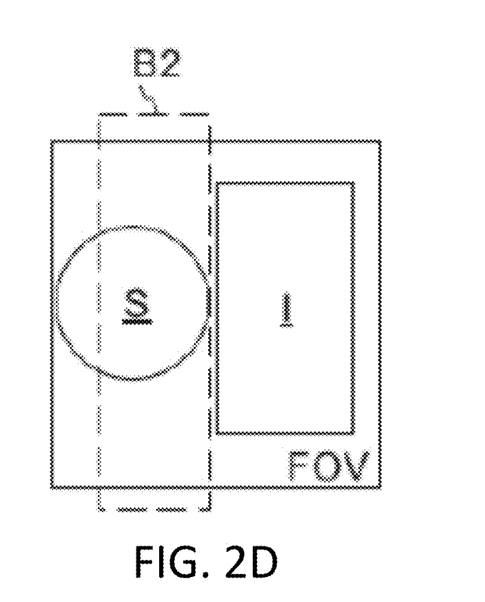

In MRI, chemical shift is a very important phenomenon, as when the static magnetic field is not uniform in intensity, the precession frequencies of fat and water will be affected by local magnetic fields and deviations will occur. Non-uniformity of the magnetic field may occur in regions with significant changes in anatomical structure morphology. FIG. 1 is a schematic diagram of the chemical shift between water and fat. As shown in FIG. 1, when the intensity of the static magnetic field is 1.5 T, the chemical shift between water (W) and fat (F) is 220 Hz; when the intensity of the static magnetic field is 3 T, the chemical shift between water and fat is 440 Hz.

The chemical shift is more significant in high-field systems (for example, a 3 T system). In order to prevent negative impacts of a regional saturation band and the possibility of exciting the region of interest by mistake, the current solution for 3 T systems is to use a hard-coding method to implicitly reduce the width of saturation bands. Specifically, the width of a saturation band is implicitly reduced to 85% of that actually required by the user. With this method, it is assumed that within the 15% reduced area, where the worst-case chemical shift occurs, the saturation pulse will not affect the region of interest.

FIG. 2 shows the comparison of the chemical shift of a saturation band between when the hard-coding method is and is not used. In FIG. 2, S represents a region to be suppressed, for example, fat, and I represents the region of interest. The dotted box B1 in FIG. 2A is the saturation band actually set by the user, and FIG. 2B is a schematic diagram of the worst-case chemical shift when the saturation band shown in FIG. 2A is used. It can be seen that, when the worst-case chemical shift occurs, the chemical shift of the saturation band B1 will cause wrong excitation of the region of interest I. The dotted box B2 in FIG. 2C is B1, with a width reduced by 15%, and FIG. 2D is a schematic diagram of the worst-case chemical shift when the saturation band shown in FIG. 2C is used. It can be seen that, when the worst-case chemical shift occurs, the chemical shift of the saturation band B2 will not cause wrong excitation of the region of interest I.

With the method of implicitly reducing the width of the saturation band, wrong excitation of the region of interest can be prevented, but the reduction of the saturation band will reduce the saturation region, resulting in the suppressed region being narrower than required and a suppression effect being not as expected.

In view of this, the embodiments of the present disclosure provide a method, device, and an MRI system for saturation band MRI scanning, which prevent the wrong excitation of the region of interest by the saturation pulse without changing the width of the saturation band.

The technical solution of the embodiments of the present disclosure may be implemented in the following manner:

A method for saturation band MRI scanning, comprising:

Obtaining the position of a saturation band of the saturation band MRI;

Obtaining the position of the region of interest to be imaged;

Taking the direction from the saturation band to the region of interest as a first direction;

Determining the direction of the slice selection gradient;

Starting saturation band MRI scanning, wherein the slice selection gradient is applied on the saturation band in the direction of the slice selection gradient, and, when the direction of the slice selection gradient is the same as the first direction, the gradient sign of the applied slice selection gradient is positive and the intensity of the corresponding magnetic field gradually increases, and when the direction of the slice selection gradient is opposite to the first direction, the gradient sign of the applied slice selection gradient is negative and the intensity of the corresponding magnetic field gradually decreases.

Obtaining the position of a saturation band of the saturation band MRI comprises: determining the central point of the saturation band of the saturation band MRI;

Obtaining the position of the region of interest to be imaged comprises: determining the central point of the field of view (FOV) of imaging;

Taking the direction from the saturation band to the region of interest as a first direction comprises: taking the direction from the central point of the saturation band to the central point of the FOV as a first direction.

At the same time as the slice selection gradient is applied on the saturation band in the direction of the slice selection gradient, the method further comprises:

Applying a radio frequency saturation pulse on the slice selected by the slice selection gradient.

A device for saturation band MRI scanning, comprising:

A direction determining module or circuitry (e.g. processing circuitry that may include hardware such as one or more processors, software such as executable instructions, or combinations thereof), used to obtain the position of a saturation band of the saturation band MRI, obtain the position of the region of interest to be imaged, take the direction from the saturation band to the region of interest as a first direction; and determine the direction of the slice selection gradient;

A slice selection gradient control module or circuitry (e.g. processing circuitry that may include hardware such as one or more processors, software such as executable instructions, or combinations thereof) for controlling the application of the slice selection gradient, used to, when the saturation band MRI scanning starts, apply the slice selection gradient on the saturation band in the direction of the slice selection gradient, wherein, when the direction of the slice selection gradient is the same as the first direction, the gradient sign of the applied slice selection gradient is positive and the intensity of the corresponding magnetic field gradually increases, and when the direction of the slice selection gradient is opposite to the first direction, the gradient sign of the applied slice selection gradient is negative and the intensity of the corresponding magnetic field gradually decreases.

Obtaining, by the direction determining module or circuitry, the position of a saturation band of the saturation band MRI comprises: determining the central point of the saturation band of the saturation band MRI;

Determining, by the direction determining module, the position of the region of interest to be imaged comprises: determining the central point of the field of view (FOV) of imaging;

Taking, by the direction determining module, the direction from the saturation band to the region of interest as a first direction comprises: taking the direction from the central point of the saturation band to the central point of the FOV as a first direction.

The device further comprises: an RF control module or circuitry (e.g. processing circuitry that may include hardware such as one or more processors, software such as executable instructions, or combinations thereof) for controlling the application of radio frequency saturation pulses, used to apply a radio frequency saturation pulse on the slice selected by the slice selection gradient.

A device for saturation band MRI scanning, comprising: a memory and a processor that can access the memory, wherein the memory stores an instruction, which, when executed by the processor, causes the processor to execute the steps of the method described in any of the above paragraphs.

An MRI system, comprising the devices for saturation band MRI scanning described in any of the above paragraphs.

In the embodiments of the present disclosure, when the slice selection gradient is in the same direction as that from the saturation band to the region of interest, the sign of the applied slice selection gradient is positive and the intensity of the corresponding magnetic field gradually increases; otherwise, the sign of the applied slice selection gradient is negative and the intensity of the corresponding magnetic field gradually decreases, so that the chemical shift caused by the slice selection gradient in the saturation band is always away from the region of interest, and wrong excitation of the region of interest by the saturation pulse can be prevented without changing the width of the saturation band.

As further discussed herein, the disclosure relates to techniques for saturation band MRI scanning. The techniques include obtaining the position of a saturation band of the saturation band MRI; obtaining the position of the region of interest to be imaged; taking the direction from the saturation band to the region of interest as a first direction; determining the direction of the slice selection gradient; starting saturation band MRI scanning. The slice selection gradient is applied on the saturation band in the direction of the slice selection gradient and, when the direction of the slice selection gradient is the same as the first direction, the gradient sign of the applied slice selection gradient is positive and the intensity of the corresponding magnetic field gradually increases. When the direction of the slice selection gradient is opposite to the first direction, the gradient sign of the applied slice selection gradient is negative and the intensity of the corresponding magnetic field gradually decreases. The chemical shift caused by the slice selection gradient in the saturation band is away from the region of interest so that wrong excitation of the region of interest by the saturation pulse can be prevented without changing the width of the saturation band.

BRIEF DESCRIPTION OF THE DRAWINGS/FIGURES

The preferred embodiments of the present disclosure will be described in detail below with reference to the drawings, so that those skilled in the art will better understand the above and other features and advantages of the present disclosure. In the drawings.

In the drawings, the following reference numerals are used:

| Numeral | Meaning |
|---|---|
| 301-303 | Steps |
| 90 | Device for saturation band MRI scanning |
| 91 | Direction determining module |
| 92 | Module for controlling the application of the slice selection gradient |
| 100 | Device for saturation band MRI scanning |
| 101 | Memory |
| 102 | Processor |

DETAILED DESCRIPTION

The following example embodiments will further illustrate the present disclosure in detail in order to clarify its purpose, technical solution and advantages.

Figure 3:
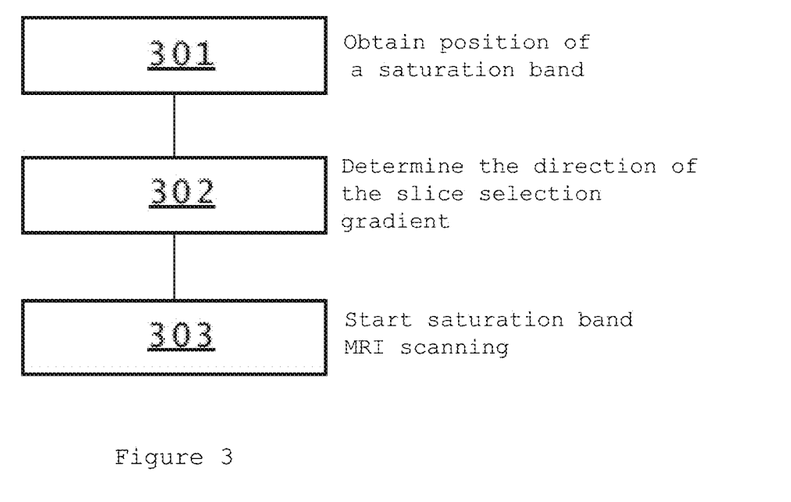
FIG. 3 is a flowchart of the method for saturation band MRI scanning provided by the embodiments of the present disclosure.

FIG. 3 is a flowchart of the method for saturation band MRI scanning provided by the embodiments of the present disclosure, wherein the specific steps are as follows:

Step 301: obtaining the position of a saturation band of the saturation band MRI, obtaining the position of the region of interest to be imaged, and taking the direction from the saturation band to the region of interest as a first direction.

Step 302: determining a direction of the slice selection gradient.

The saturation band is perpendicular to the region of interest, and the slice selection gradient is perpendicular to the saturation band. Then, there are two directions for the slice selection gradient: one is the same as the direction from the saturation band to the region of interest, and the other is opposite to the direction from the saturation band to the region of interest.

Step 303: start saturation band MRI scanning, wherein the slice selection gradient is applied on the saturation band in the direction of the slice selection gradient and, when the direction of the slice selection gradient is the same as the first direction, the gradient sign of the applied slice selection gradient is positive and the intensity of the corresponding magnetic field gradually increases and, when the direction of the slice selection gradient is opposite to the first direction, the gradient sign of the applied slice selection gradient is negative and the intensity of the corresponding magnetic field gradually decreases.

At the same time as the slice to be excited is selected by the slice selection gradient, a radio frequency saturation pulse is applied on the slice selected.

In the above embodiment, when the slice selection gradient is in the same direction as that from the saturation band to the region of interest, the sign of the applied slice selection gradient is positive and the intensity of the corresponding magnetic field gradually increases; otherwise, the sign of the applied slice selection gradient is negative and the intensity of the corresponding magnetic field gradually decreases, so that the chemical shift caused by the slice selection gradient in the saturation band is always away from the region of interest, and wrong excitation of the region of interest by the saturation pulse can be prevented without changing the width of the saturation band.

In an alternative embodiment, in step 301 obtaining the position of a saturation band of the saturation band MRI comprises: determining the central point of the saturation band of the saturation band MRI;

Obtaining the position of the region of interest to be imaged comprises: determining the central point of the field of view (FOV) of imaging;

Taking the direction from the saturation band to the region of interest as a first direction comprises: taking the direction from the central point of the saturation band to the central point of the FOV as a first direction.

Through the above embodiment, it is ensured that the chemical shift caused by the slice selection gradient in the saturation band is always away from the region of interest.

Figure 4A:
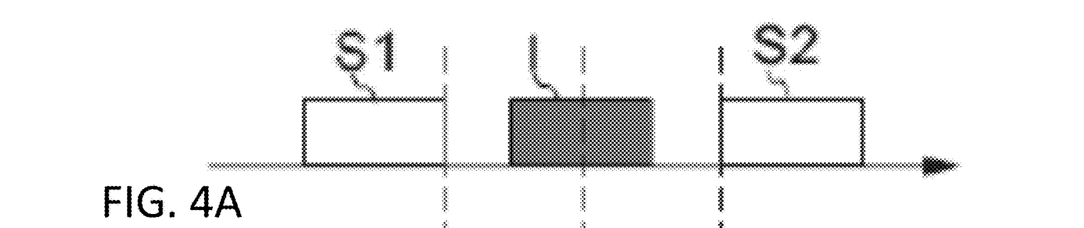
FIGS. 4A-4C are schematic diagrams of the relationship between the chemical shift of the suppressed region on the one hand and the gradient sign and the intensity of the magnetic field on the other hand provided by the embodiments of the present disclosure.
Figure 4B:
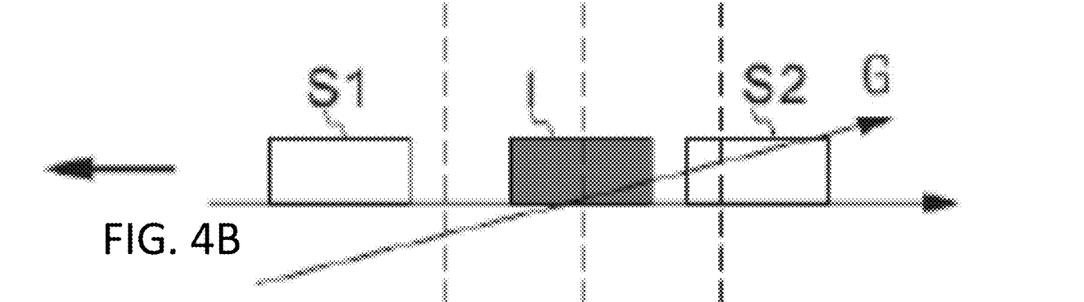
Figure 4C:
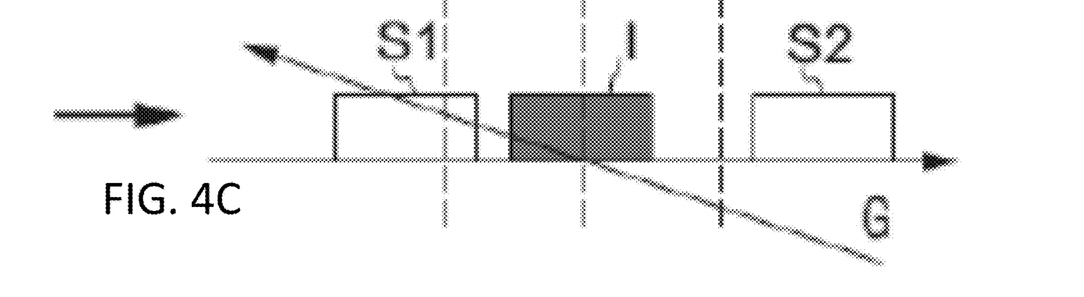

FIGS. 4A-4C are schematic diagrams showing the relationship between the chemical shift of the suppressed region on the one hand and the gradient sign and the intensity of the magnetic field on the other hand. In the FIGS. 4A-4C, S1 and S2 represents the regions to be suppressed, and I represents the region of interest. In FIG. 4A, no gradient is applied, and no chemical shift occurs in S1 or S2 on the two sides of I. In FIG. 4B, a gradient is applied, negative on the left and positive on the right, with the intensity of the magnetic field gradually increasing from left to right. It can be seen that chemical shift in S1 on the left is to the left, i.e., away from I; while chemical shift in S2 on the right is also to the left, i.e., approaching I, as shown by the black arrow in FIG. 4B. In FIG. 4C, a gradient is applied, negative on the right and positive on the left, with the intensity of the magnetic field gradually increasing from right to left. It can be seen that chemical shift in S1 on the left is to the right, i.e., approaching I, while chemical shift in S2 on the right is also to the right, i.e., away from I, as shown by the black arrow in FIG. 4C.

It can be seen from FIGS. 4B and 4C that, when the intensity of the magnetic field applied to the regions to be suppressed is lower than the intensity of the magnetic field applied to the region of interest, the chemical shift in the regions to be suppressed will be away from the region of interest.

Therefore, to keep the chemical shift of the saturation band away from the region of interest, a relationship shown in Table 1 can be obtained:

TABLE 1

| Direction of the slice selection gradient | Direction from the saturation band to the region of interest | Sign of the slice selection gradient and intensity of the magnetic field |
| --- | --- | --- |
| From right to left | Left | From positive to negative, gradually decreasing |
| From right to left | Right | From negative to positive, gradually increasing |
| From left to right | Left | From negative to positive, gradually increasing |
| From left to right | Right | From positive to negative, gradually decreasing |

Figure 5A:
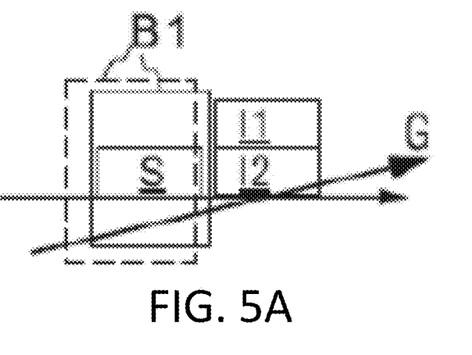
FIGS. 5A-5D are schematic diagrams of the setup of the slice selection gradient provided by the embodiments of the present disclosure.
Figure 5B:
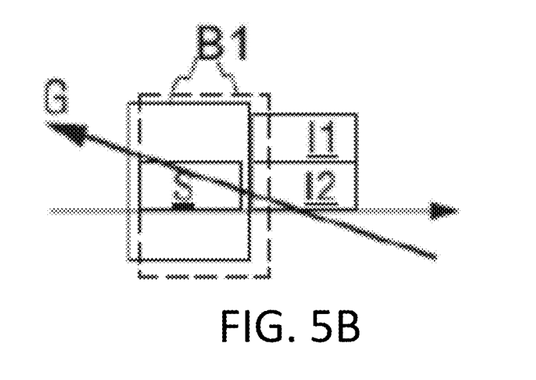
Figure 5C:
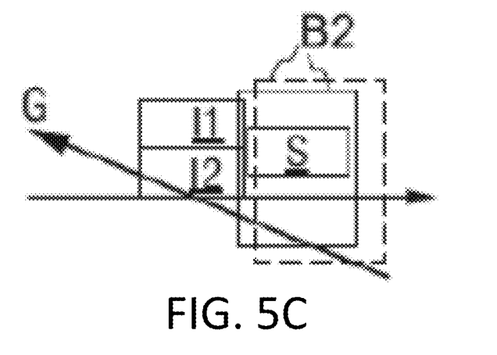
Figure 5D:
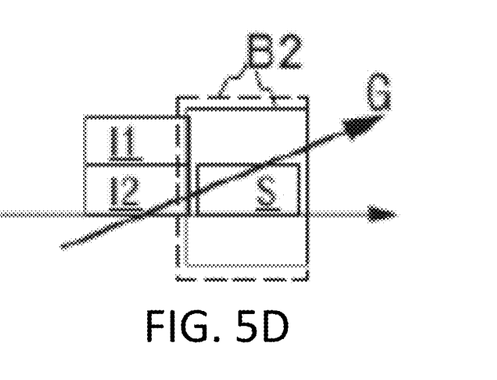

FIGS. 5A-5D illustrate schematic diagrams of the setup of the slice selection gradient by use of the present disclosure. In the FIGS. 5A-5D, S represents a region to be suppressed, and I1 and I2 represent the regions of interest. FIGS. 5A and 5C represent schematic diagrams in which the correct slice selection gradient is used, while FIGS. 5B and 5D represent schematic diagrams in which the wrong slice selection gradient is used. Specifically:

In FIG. 5A, the saturation band B1 is on the left of the regions of interest I1 and I2, the direction of the slice selection gradient is from left to right, and the sign of the slice selection gradient and the magnetic field intensity are: from negative to positive, gradually increasing, as shown by the third case in Table 1. It can be seen that chemical shift of the saturation band B1 is to the left, i.e., away from the regions of interest I1 and I2;

In FIG. 5B, the position of the saturation band B1 and the direction of the slice selection gradient are the same as those in FIG. 5A, but the sign of the slice selection gradient and the magnetic field intensity are: from positive to negative, gradually decreasing. It can be seen that chemical shift of the saturation band B1 is to the right, i.e., approaching the regions of interest I1 and I2;

In FIG. 5C, the saturation band B2 is on the right of the regions of interest I1 and I2, the direction of the slice selection gradient is from right to left, and the sign of the slice selection gradient and the magnetic field intensity are: from negative to positive, gradually increasing, as shown by the second case in Table 1. It can be seen that chemical shift of the saturation band B2 is to the right, i.e., away from the regions of interest I1 and I2;

In FIG. 5D, the position of the saturation band B2 and the direction of the slice selection gradient are the same as those in FIG. 5C, but the sign of the slice selection gradient and the magnetic field intensity are: from positive to negative, gradually decreasing. It can be seen that chemical shift of the saturation band B2 is to the left, i.e., approaching the regions of interest I1 and I2.

Verification of the present disclosure by simulated experiments is described below.

Figure 6A:
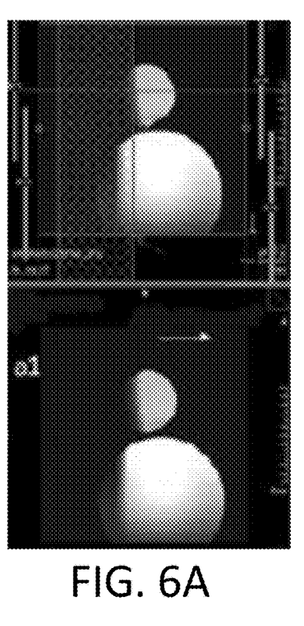
FIGS. 6A-6C illustrate a comparison of simulated saturation band MRI experiments by the existing hard-coding method and by the embodiments of the present disclosure, when a saturation band exists only on one side of the FOV center.
Figure 6B:
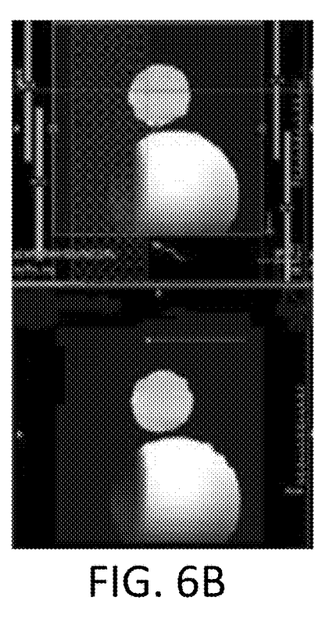
Figure 6C:
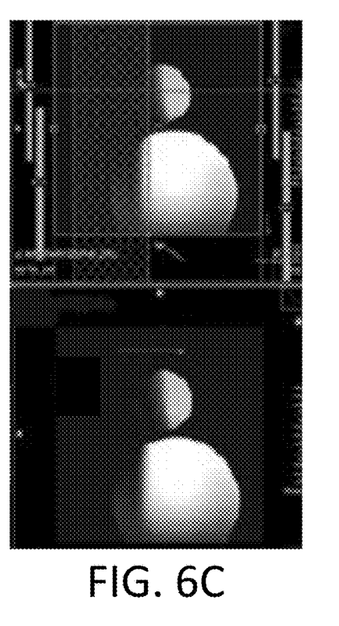

FIGS. 6A-6C illustrate a comparison of simulated saturation band MRI experiments by the existing hard-coding method and by the embodiments of the present disclosure, when a saturation band exists only on one side of the FOV center. In FIGS. 6A-6C, the small cylindrical mold in the upper part is filled with oil, and the large cylindrical mold in the lower part is filled with CuSO4 (copper sulfate). The rectangular grids in FIGS. 6A-6C on top indicates the saturation band, and the white arrows in FIGS. 6A-6C at the bottom indicate the direction of chemical shift;

The top and at the bottom grids associated with FIG. 6A show the chemical shift of the saturation band when a conventional hard-coding method is used to implicitly narrow the saturation band and TSE (turbo spin echo) for MRI scanning, wherein the width of the saturation band is implicitly reduced by 15%. It is obvious that the chemical shift of the saturation band is to the right, i.e., approaching the FOV center. The reduction of the saturation band can prevent wrong excitation of the tissue on the right.

The two grids associated with FIG. 6B show the chemical shift of the saturation band when the method provided by the embodiments of the present disclosure to set the slice selection gradient and TSE for MRI scanning, wherein, through setting the sign of the slice selection gradient and the intensity of the magnetic field, chemical shift of the saturation band is to the left, i.e., away from the tissue on the right, without changing the width of the saturation band.

The two grids associated with FIG. 6C show the chemical shift of the saturation band when a slice selection gradient of the opposite sign and change of magnetic field intensity to those in FIG. 6B is used and TSE is used for MRI scanning, wherein, as the sign of the slice selection gradient and the change of the intensity of the magnetic field are opposite to those in FIG. 6B, chemical shift of the saturation band is to the right, i.e., approaching the tissue on the right. It can be seen that the chemical shift to the right will cause wrong excitation of the tissue on the right in TSE.

From FIGS. 6A-6C, it can be seen that the direction of chemical shift of a saturation band can be changed through changing the sign of the slice selection gradient and the intensity of the magnetic field.

It should be noted that there are small white characters in some areas of FIGS. 6A-6C, which are attached to the original image, and the removal of which will delete some details in the image at the same time. Therefore, these small characters are not removed here. These small characters are not directly relevant to the solution of the present disclosure. The unintelligibility of these small characters does not affect the interpretation of the present disclosure by the Figures.

Figure 7A:
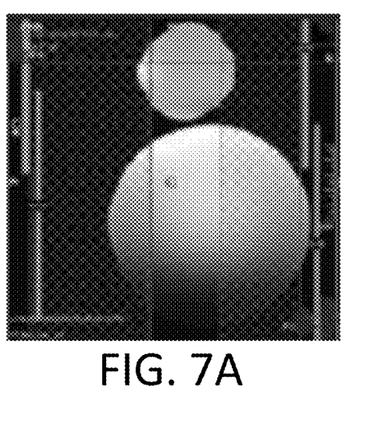
FIGS. 7A-7D illustrate a comparison of simulated saturation band MRI experiments by a conventional hard-coding method and by using the embodiments of the present disclosure, when saturation bands exist on both sides of the FOV center.
Figure 7B:
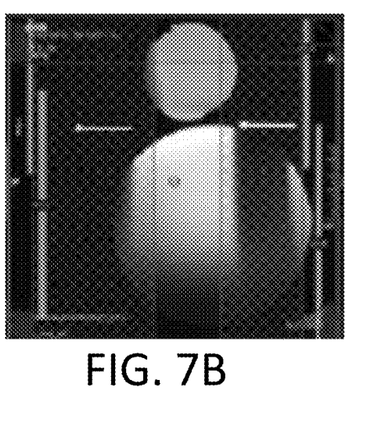
Figure 7C:
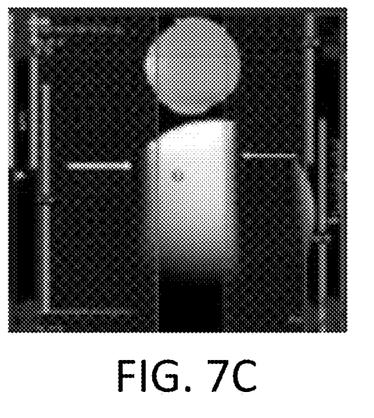
Figure 7D:
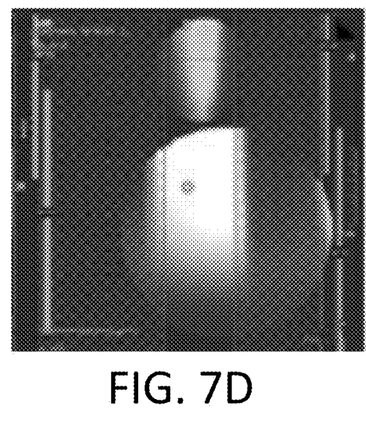

In FIGS. 6A-6C, a saturation band exists only on one side of the FOV center. In FIGS. 7A-7D, saturation bands exist on both sides of the FOV center. The white arrows in FIGS. 7B and 7C represents the direction of increase of the magnetic field intensity, wherein:

FIG. 7A illustrates the saturation band set by the existing hard-coding method, i.e., the width of the saturated band is reduced by 15% compared to the width set by the user;

FIG. 7B uses the saturation band shown in FIG. 7A. It can be seen that the intensity of the gradient magnetic field increases in the same direction in the saturation bands on the left and on the right, both increasing from right to left, and the chemical shifts of the left and right saturation bands are both to the right, i.e., that of the saturation band on one side is approaching the FOV center, and that of the saturation band on the other side is moving away from the FOV center;

FIG. 7C uses the method of the present disclosure, and the width of the saturation band is not changed, wherein the intensity of the gradient magnetic field increases in opposite directions in the saturation bands on the left and on the right, wherein, the intensity of the gradient magnetic field on the left saturation band increases from left to right, and that on the right saturation band increases from right to left, the chemical shift of the left saturation band is to the left, and the chemical shift of the right saturation band is to the right, both moving away from the FOV center;

FIG. 7D also uses the method of the present disclosure, but the intensity of the gradient magnetic field on the saturation bands on the left and the right increases in the opposite direction to that in FIG. 7C. It can be seen that the chemical shifts of the saturation bands on both sides approach the FOV center.

It can be seen that, when there are saturation bands on both sides of the FOV, when the conventional hard-coding method is used, the chemical shifts of the saturation bands on both sides are in the same direction; while with the present disclosure, slice selection gradients of different signs and the intensities of the magnetic fields can be applied on the saturation bands on the two sides, so that chemical shifts of the two saturation bands are in the different directions, making it possible to completely prevent wrong excitation of the region of interest by the saturation pulse.

It should be noted that there are small white characters in some areas of FIGS. 7A-7D, which are attached to the original image, and the removal of which will delete some details in the image at the same time. Therefore, these small characters are not removed here. These small characters are not directly relevant to the solution of the present disclosure. The unintelligibility of these small characters does not affect the interpretation of the present disclosure by the Figures.

FIGS. 8A-8D illustrate a comparison of the imaging results of in vivo experiments with an MRI spectral system by the conventional hard-coding method and the present disclosure. In the FIGS. 8A-8D, a volunteers' c-spine is imaged, with the following imaging parameters: FOV size=220×220 mm (millimeters), slice thickness=3 mm, TE/TR (echo time/repetition time)=108/3,500 ms (milliseconds), phase OS (oversampling rate)=80%, BaseRes (base resolution)=384, PhaseRes (ratio of phase resolution to base resolution)=70%, voxel size=0.6×0.6×3 mm, BW (bandwidth)/pixel=260 HZ (Hertz), ESP (echo interval)=10.8 ms, ETL (echo chain length)=19.

Figure 8A:
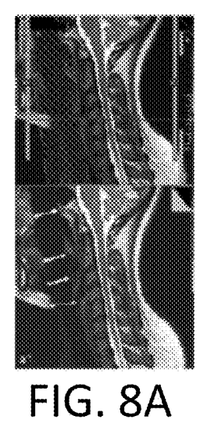
FIGS. 8A-8D illustrate a comparison of the imaging results of in vivo experiments with an MRI spectral system by a conventional hard-coding method and by using the embodiments of the present disclosure.
Figure 8B:
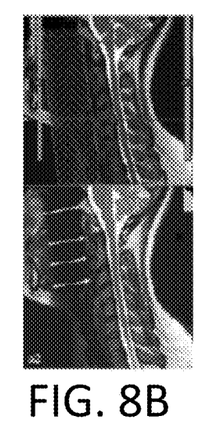
Figure 8C:
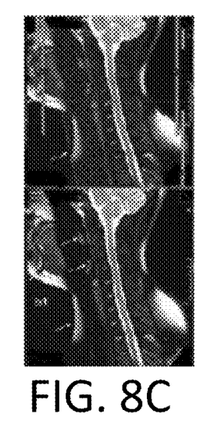
Figure 8D:
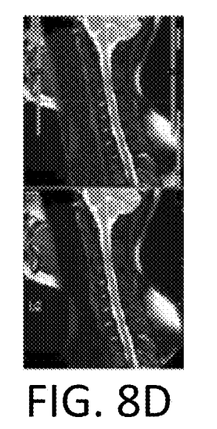

In FIGS. 8A and 8C, the imaging results using the existing hard-coding method are shown, and in FIGS. 8B and 8D the imaging results using the present disclosure are shown. The upper images in the Figures A-D schematically show the positions of the corresponding saturation bands. Obviously, in Figures B and D, since the saturation bands are not reduced and the region of interest is not wrongly excited, the saturated regions are more accurate and the imaging results are clearer.

It should be noted that there are small white characters in some areas of FIGS. 8A-8D, which are attached to the original image, and the removal of which will delete some details in the image at the same time. Therefore, these small characters are not removed here. These small characters are not directly relevant to the solution of the present disclosure. The unintelligibility of these small characters does not affect the interpretation of the present disclosure by the Figures.

Figure 9:
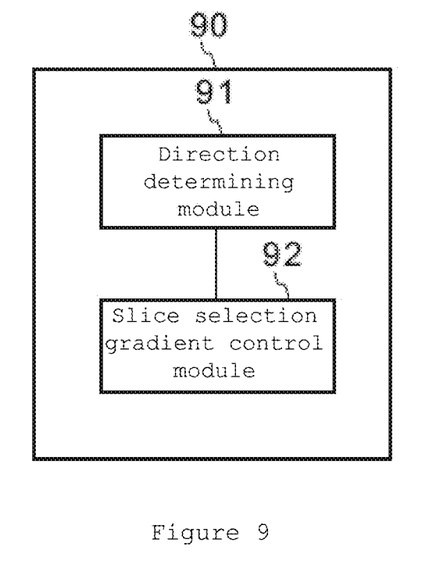
FIG. 9 is a schematic structural diagram of the device for saturation band MRI scanning provided by an embodiment of the present disclosure.

FIG. 9 is a schematic structural diagram of a device 90 for saturation band MRI scanning provided by an embodiment of the present disclosure. The device mainly comprises:

A direction determining module or circuitry (e.g. processing circuitry that may include hardware such as one or more processors, software such as executable instructions, or combinations thereof) 91, used to obtain the position of a saturation band of the saturation band MRI, obtain the position of the region of interest to be imaged, take the direction from the saturation band to the region of interest as a first direction; and determine the direction of the slice selection gradient;

A slice selection gradient control module or circuitry (e.g. processing circuitry that may include hardware such as one or more processors, software such as executable instructions, or combinations thereof) 92 for controlling the application of the slice selection gradient, used to, when the saturation band MRI scanning starts, apply the slice selection gradient on the saturation band in the direction of the slice selection gradient, wherein, when the direction of the slice selection gradient is the same as the first direction, the gradient sign of the applied slice selection gradient is positive and the intensity of the corresponding magnetic field gradually increases, and when the direction of the slice selection gradient is opposite to the first direction, the gradient sign of the applied slice selection gradient is negative and the intensity of the corresponding magnetic field gradually decreases.

In an alternative embodiment, obtaining, by the direction determining module 91, the position of a saturation band of the saturation band MRI comprises: determining the central point of the saturation band of the saturation band MRI;

Determining, by the direction determining module 91, the position of the region of interest to be imaged comprises: determining the central point of the field of view (FOV) of imaging;

Taking, by the direction determining module 91, the direction from the saturation band to the region of interest as a first direction comprises: taking the direction from the central point of the saturation band to the central point of the FOV as a first direction.

In an alternative embodiment, the device further comprises: an RF control module or circuitry (e.g. processing circuitry that may include hardware such as one or more processors, software such as executable instructions, or combinations thereof) for controlling the application of radio frequency saturation pulses, used to apply a radio frequency saturation pulse on the slice selected by the slice selection gradient.

Figure 10:
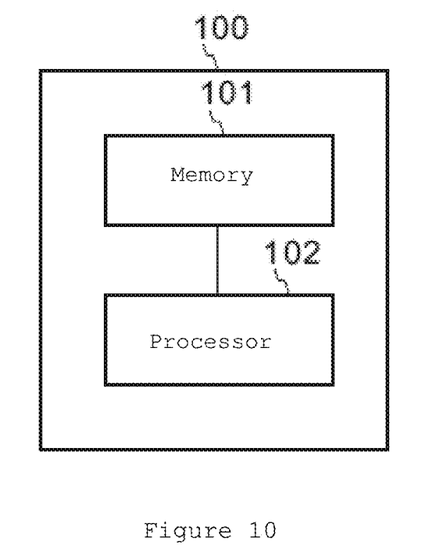
FIG. 10 is a schematic structural diagram of a device for saturation band MRI scanning provided by an embodiment of the present disclosure.

FIG. 10 is a schematic structural diagram of a device 100 for saturation band MRI scanning provided by another embodiment of the present disclosure, and the device mainly comprises: a memory 101 and a processor 102 that can access the memory 101, wherein the memory 101 stores an instruction, which, when executed by the processor 102, causes the processor 102 to execute the steps of the method for saturation band MRI scanning described in steps 301-303. The devices 90 and 100 may combined or integrated together and/or or each be implemented by an MR imaging apparatus, in accordance with various embodiments.

The embodiments of the present disclosure also provide an MRI system, comprising the devices for saturation band MRI scanning described in any of the above paragraphs.

It should be noted that, since the present disclosure determines the sign of the slice selection gradient and the magnetic field intensity by comparing the direction of the slice selection gradient with the direction from the saturation band to the region of interest, the present disclosure does not need to consider whether the saturation band is symmetrical or not, i.e., the present disclosure is not only suitable for symmetrical saturation bands, but also for asymmetrical saturation bands.

The above are only the preferred embodiments of the present disclosure, and are not intended to limit the present disclosure. Any modification, equivalent replacement and improvement made without departing from the motivation and principle of the present disclosure shall be included in its scope

What is claimed is:

1. A method for performing saturation band magnetic resonance imaging (MRI) scanning, comprising:
    obtaining, via one or more processors, a position of a saturation band associated with an MRI scan;
    obtaining, via one or more processors, a position of a region of interest (ROI) to be imaged,
    wherein a direction from the saturation band to the ROI is identified with a first direction;
    determining, via one or more processors, a direction of a slice selection gradient; and
    performing, via one or more processors, saturation band MRI scanning,
    wherein a slice selection gradient is applied on the saturation band in the direction of the determined slice selection gradient such that:
        when the direction of the slice selection gradient is the same as the first direction, the gradient sign of the applied slice selection gradient is positive and an intensity of a corresponding magnetic field gradually increases; and
        when the direction of the slice selection gradient is opposite to the first direction, the gradient sign of the applied slice selection gradient is negative and an intensity of a corresponding magnetic field gradually decreases.

2. The method according to claim 1, wherein:
    the obtaining the position of the saturation band comprises determining a central point of the saturation band,
    the obtaining the position of the ROI to be imaged comprises determining the central point of a field of view (FOV) of imaging, and
    the direction from the central point of the saturation band to the central point of the FOV is identified with the first direction.

3. The method according to claim 1, further comprising:
    concurrent with applying the slice selection gradient on the saturation band in the direction of the slice selection gradient, applying a radio frequency saturation pulse on a slice selected by the slice selection gradient.

4. A device for performing saturation band magnetic resonance imaging (MRI) scanning, comprising:
    direction determining circuitry configured to (i) obtain a position of a saturation band associated with an MRI scan, and (ii) obtain a position of a region of interest (ROI) to be imaged, a direction from the saturation band to the ROI being identified with a first direction, and (iii) determine a direction of a slice selection gradient;
    slice selection gradient control circuitry configured to control an application of the slice selection gradient when saturation band MRI scanning starts by:
        applying the slice selection gradient on the saturation band such that (i) when the direction of the slice selection gradient is the same as the first direction, the gradient sign of the applied slice selection gradient is positive and an intensity of a corresponding magnetic field gradually increases, and (ii) when the direction of the slice selection gradient is opposite to the first direction, the gradient sign of the applied slice selection gradient is negative and the intensity of the corresponding magnetic field gradually decreases.

5. The device according to claim 4, wherein the direction determining circuitry is further configured to:
    obtain the position of the saturation band of the saturation band by determining a central point of the saturation band;
    determine the position of the region of interest to be imaged by determining the central point of a field of view (FOV) of imaging, and
    wherein the direction from the central point of the saturation band to the central point of the FOV is identified with the first direction.

6. The device according to claim 4, wherein the device further comprises:
    radio frequency (RF) circuitry configured to control an application of RF saturation pulses to apply a RF saturation pulse on a slice selected by the slice selection gradient.

7. A device for performing saturation band magnetic resonance imaging (MRI) scanning, comprising:
    a memory having instructions stored thereon; and
    a processor configured to execute instructions stored in the memory to cause the device to:
    obtain a position of a saturation band associated with an MRI scan;
    obtain a position of a region of interest (ROI) to be image,
    wherein a direction from the saturation band to the ROI is identified with a first direction;
    determine a direction of a slice selection gradient; and
    perform saturation band MRI scanning,
    wherein a slice selection gradient is applied on the saturation band in the direction of the determined slice selection gradient such that:
        when the direction of the slice selection gradient is the same as the first direction, the gradient sign of the applied slice selection gradient is positive and an intensity of a corresponding magnetic field gradually increases; and
        when the direction of the slice selection gradient is opposite to the first direction, the gradient sign of the applied slice selection gradient is negative and an intensity of a corresponding magnetic field gradually decreases.

8. The device according to claim 7, wherein the instructions, when executed by the processor, further cause the device to:
    obtain the position of the saturation band by determining a central point of the saturation band, and
    obtain the position of the ROI to be imaged by determining the central point of a field of view (FOV) of imaging,
    wherein the direction from the central point of the saturation band to the central point of the FOV is identified with the first direction.

9. The device according to claim 7, wherein the instructions, when executed by the processor, further cause the device to:
    concurrent with applying the slice selection gradient on the saturation band in the direction of the slice selection gradient, apply a radio frequency saturation pulse on a slice selected by the slice selection gradient.

10. The method of claim 1, wherein the slice selection gradient is applied on the saturation band in the direction of the determined slice selection gradient such that a chemical shift of the saturation band is in a direction opposite to the first direction.

11. The method of claim 10, wherein the chemical shift is associated with a region to be suppressed comprising fat tissue.

12. The method of claim 10, wherein the slice selection gradient is applied on the saturation band to cause the chemical shift of the saturation band in the direction opposite to the first direction without performing adjustments to a width of the saturation band.

* * * * *